United States Patent [19]
Palkovich et al.

[11] Patent Number: 5,519,372
[45] Date of Patent: May 21, 1996

[54] MAGNETS PROVIDING PATIENT ACCESSIBILITY

[75] Inventors: Alex Palkovich, Oxford; John Bird, Charlbury; Tomas Duby, Oxon; John Simkin, Oxford, all of England

[73] Assignee: Elscint Ltd., Haifa, Israel

[21] Appl. No.: 243,836

[22] Filed: May 17, 1994

[30] Foreign Application Priority Data

May 27, 1993 [GB] United Kingdom ............... 9310956

[51] Int. Cl.⁶ ............................................. G01R 33/38
[52] U.S. Cl. ...................... 335/216; 335/296; 335/297; 324/318; 128/653.5
[58] Field of Search ..................... 335/216, 296–298, 335/301, 304, 306; 128/653.1, 653.5; 324/318, 319, 320; 310/11

[56] References Cited

U.S. PATENT DOCUMENTS

| | | | |
|---|---|---|---|
| 4,829,252 | 5/1989 | Kaufman | 324/309 |
| 5,194,810 | 3/1993 | Breneman et al. | 324/319 |
| 5,207,224 | 5/1993 | Dickinson et al. | 128/653.5 |
| 5,250,901 | 10/1993 | Kaufman et al. | 324/318 |

*Primary Examiner*—Leo P. Picard
*Assistant Examiner*—Raymond M. Barrera
*Attorney, Agent, or Firm*—Greenblum & Bernstein

[57] ABSTRACT

A magnet for MRI systems having a first pair of spaced apart oppositely disposed walls with a first pole piece extending from one wall of said first pair of walls towards a second pole piece extending from the other wall of the pair of walls with an air gap between the first and the second pole pieces. A superconducting coil mounted on at least one of the first and the second pole pieces to generate a magnetic field between the pole pieces with the air gap between the pole pieces large enough for receiving a patient therein fop magnetic resonance imaging purposes; and a second pair of oppositely disposed walls closing said magnetic circuit; there being sufficient room between the walls to enable medical personnel to be between the walls of the second pair of walls and the pole pieces providing substantially complete access to the patient in the air gap.

12 Claims, 5 Drawing Sheets

MAGNETS PROVIDING PATIENT ACCESSIBILITY

FIELD OF THE INVENTION

This invention is concerned with superconducting magnets for use in magnetic resonance imaging (MRI) systems, and more particularly with magnets herein referred to as "H-shaped" magnets.

BACKGROUND OF THE INVENTION

Superconducting magnets presently in use in MRI systems are basically cylindrically shaped with a magnet in a cryostat and having a bore tube external to the cryostat through which the generated magnetic flux runs.

A patient in a prone position is placed in the bore tube virtually coaxial with the longitudinal axis of the cylindrical magnet. Thus, the magnetic lines of force run parallel to the longitudinal axis of the patient.

Among the drawbacks of the present cylindrical magnets is that the patient is wholly within the cylinder; i.e., from the time the patient is positioned in the bore tube, the doctor does not have ready access to the patient. The lack of access presents a severe problem when the patient is in critical condition and needs continual or emergency aid from the doctor. Present systems require the patient to be removed from the bore tube of the magnet to enable access by the doctor. Such removal of the patient from the bore tube could be critical and in fact fatal in certain emergency cases.

The cylindrical type magnets have an additional shortcoming. The magnetic lines of flux travel largely through air which offers a much higher reluctance path than does a magnetizable material such is iron or steel. Consequently, the magnetic field is inherently weakened by the large proportion of the travel of the flux that is passing through air.

In the past, attempts have been made to provide more iron in the path of the magnetic flux. This has been attempted by using C-frame magnetic sections or what are known as "H-frame" magnet sections. In the C-frame construction, an iron or steel yoke passing through an electro magnet carries magnetic flux to oppositely disposed pole pieces. Flux crossing the air gap between these pole pieces is guided by pole shaping sections of electrical coils to form homogeneous zones suitable for MRI studies.

In general the C-frame type magnets have some fundamental problems which have inhibited their use for MRI studies. Among the problems are:

1) The C-frame magnet is mechanically imbalanced by magnetic forces applied between the poles. With the high powered magnets used there is actually some small but non-negligible movement when the superconducting coil of the magnet is conducting. The magnetic attraction upsets the homogeneity of the flux between the pole pieces; and 2) Stray field performance in the C-type magnet is much worse than the stray field performance using state of the art devices presently available for controlling the stray fields generated by cylindrical high field magnets.

Another theoretical shape design of a magnet which in theory can improve over the presently available cylindrical magnets is the H-frame magnet. Such magnets provide a double path of magnetic material for the magnetic lines of force. The H-frame has, however, in practice a number of serious problems when used in high field superconducting devices. With the H-frame, a larger magnet is needed to accommodate the cryostat, the flux path is improved, but at the expense of the larger magnet and the doctor still does not have ready access to the patient. In addition, the H-frame magnet is imbalanced magnetically and thus, there is great difficulty in obtaining homogeneous fields with the H-frame magnet.

If the magnet is to be balanced by adding a second cryostat, for example, and another set of superconducting coils, then the magnet would have to be even larger and more expensive than the single coil H-frame magnet suggested todate.

Accordingly, those skilled in the art are still searching for new and approved magnets for use in MRI systems.

BRIEF DESCRIPTION OF THE INVENTION

In accordance with a preferred aspect of the present invention, a magnet for use in MRI systems is provided, said magnet comprising:

- a pair of spaced apart oppositely disposed walls of magnetizable material,
- a first pole piece extending from one of said walls toward second pole piece extending from the other of said pair of oppositely disposed walls,
- an air gap between said first and said second pole pieces,
- a superconducting coil on at least one of said first or said second pole pieces for use in generating a magnetic field between said pole pieces,
- said air gap being sufficiently large for receiving a subject therein to be imaged using magnetic resonance,
- gradient coil means positioned to cause three orthogonal gradients in said air gap,
- RF coil means for transmitting RF magnetic fields into said air gap and for receiving free induction decay (FID) signals from the subject in the air gap, and
- magnetic circuit closing means connecting said oppositely disposed walls at opposite ends thereof but enabling ready access to said subject in said air gap between said pole pieces.

A feature of the invention comprises using a superconducting coil located in a liquid helium bath wherein the cold temperatures are maintained by a cryostat.

Yet another feature of the present invention improves utilization of a "collimator" plate which is dimensioned, positioned, and shaped to cause there to be a substantially homogeneous zone of the magnetic field to be formed between it and the oppositely disposed pole piece. The pole piece is also oppositely disposed from the pole piece having the superconductor wire associated therewith.

Yet another feature of the present invention provides means for keeping the five gauss stray field completely contained within the magnet. That feature is provided by the magnetic circuit closing means which are orthogonal walls connecting the oppositely disposed walls at opposite ends thereof. Thus, a room is created with the pair of spaced apart oppositely disposed walls being horizontal, one serving as the floor of the magnet room and the other serving as the ceiling. Oppositely disposed vertical walls are provided for closing the magnetic flux path and creating a dual walled room, for example, having a magnetizable floor, ceiling and magnetizable two walls. A third wall may also be provided of magnetizable material creating a three-walled room about the pole pieces, but enabling ready access to the patient positioned between the pole pieces. It should be noted that in this manner the longitudinal axis of the patient does not coincide with the direction of the main static magnetic field; i.e., it is perpendicular to the main static magnetic field. In yet another embodiment of the invention a magnetic enclosure may be formed as a cylinder penetrated only by an access door. The cylindrical enclosure is closed by circular ceiling and floor to each of which is attached one of the magnetic poles.

Another feature of the present invention provides yet another embodiment wherein the pole pieces extend from oppositely disposed vertical walls of the two-wall room. Here the main static magnetic field may be normal to the longitudinal axis of the patient or it may coincide with the longitudinal axis of the patient.

BRIEF DESCRIPTION OF THE DRAWINGS

The above described and other objects and features of the present invention will be best understood when considered in the light of the, following description made in conjunction with the accompanying drawings, wherein.

GENERAL DESCRIPTION

Figure 1:
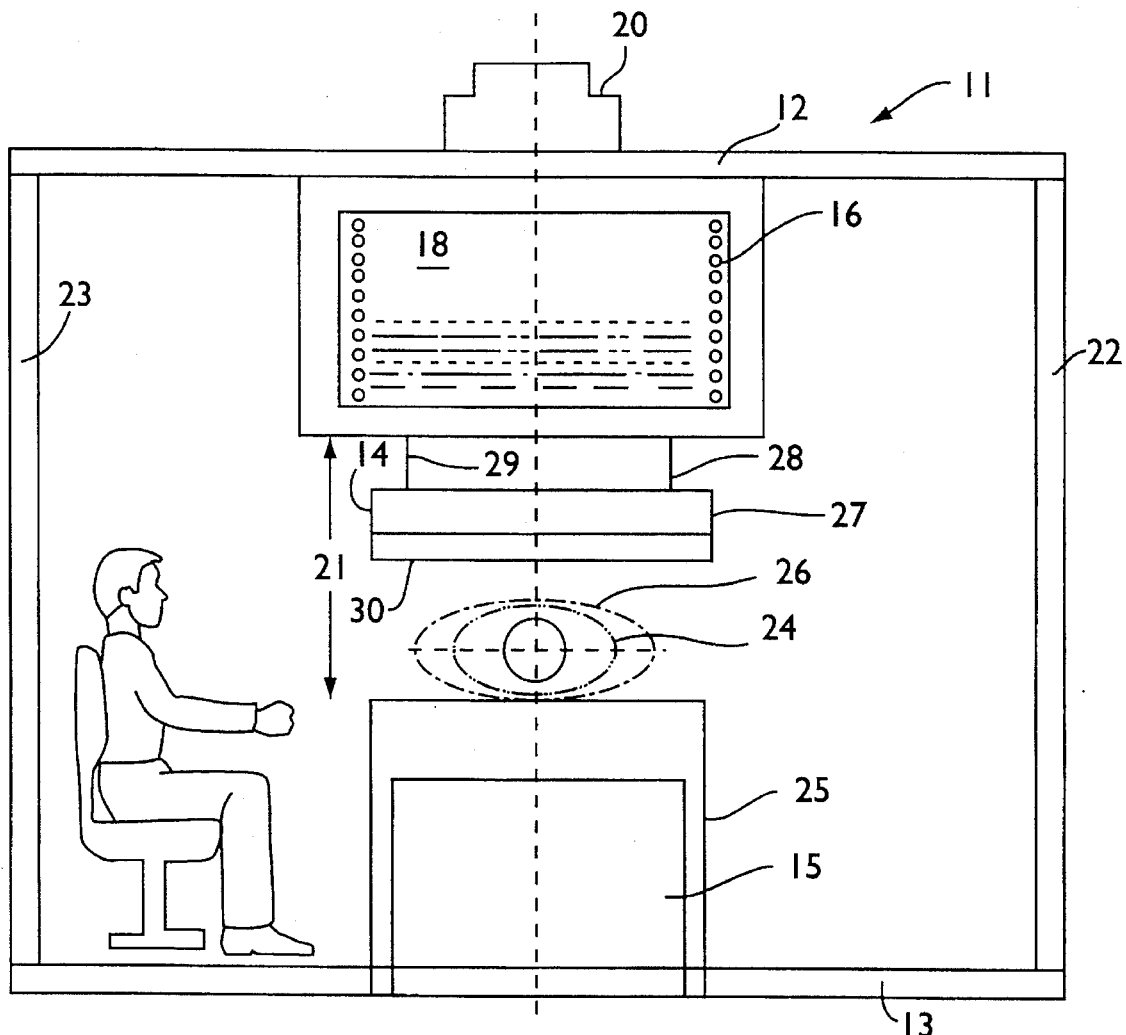
FIG. 1 is a front view showing of one version of the inventive MRI magnet.

FIG. 1 shows a front view of the magnet 11 for use in MRI imaging. It is seen that the magnet can be described as having a modified H-frame rotated 90°. Magnet 11 comprises a pair of oppositely disposed horizontal walls 12 and 13. As shown in FIG. 1, the wall 12 is like the roof of a room and wall 13 is like the floor of the room. Pole pieces 14 and 15 are oppositely disposed from each other and extend from the horizontal walls 12 and 13. At least one of the pole pieces, in this case pole piece 14, is shown as including a superconductive coil 16. The coil is in a cyrostat unit 19 which includes liquid helium shown at 19. The cyrostat 18 and liquid helium 19 maintain the coil 16 at a sub-zero temperature necessary to maintain superconductivity. Note that the cryostat 18 is much smaller than the cryostat needed for a cylindrical type superconducting magnet. The cryostat is shown as being accessible for the usual gases; i.e., helium and nitrogen, for example, necessary for maintaining the cold temperatures through a service turret shown at 20. The pole piece 15 is a counter pole in a preferred embodiment having no coils thereabout. However, in yet another embodiment of the invention the counter pole can also be surrounded by a superconducting coil if it is designed to have a higher magnetic field.

A pair of oppositely disposed vertical walls 21 and 22 provide a return path for the magnetic flux emanating from the first pole piece 14. The flux path can be traced from the pole piece 14 traversing the air gap 21 between the pole pieces, entering the pole piece 15 and passing through floor 13, vertical walls 22 and 23, horizontal ceiling wall 12 back to the originating pole piece 14 energized by the superconducting coil therein. A patient such as patient 24 is positioned in the flux path between the pole pieces for imaging purposes on a patient bed 25, for example.

In a preferred embodiment, a slab of magnetized raw material 27 hereinafter referred to as a "collimator" is suspended from the upper pole piece 14 by non-magnetizable rods such as rods 28 and 29, for example. The collimator 27 is shaped and positioned in a manner to enhance the homogeneity of the magnetic field in the area 26 between the pole pieces.

The entire magnet structure is made of a magnetizable material. Thus, the walls 12, 13, 22 and 23 are each made of slabs of iron or steel to thereby provide the low reluctance path for the magnetic flux.

As best seen in FIG. 1, there is room along the patient 24 lying on the bed 25 for the doctor and/or imaging technician to have ready access to the patient at all times. No longer does the patient have to be placed within the bore of a cylindrical magnet. It is the insertion into the enclosed bore of the magnet with its implications of being cut off from the world that causes patients with even the slightest bit of claustrophobia to avoid scans in magnetic resonance imaging equipment.

The room comprised of the ceiling 12, floor 13, and the two walls 22 and 23, is large enough so that the pole pieces are dimensioned to be longer than the length of even the unusually tall patient.

As a minimum, the cryo equipment merely has to enclose the windings for one pole piece. Therefore, the cryo equipment is relatively small as compared to cryo for the cylindrical magnets and thereby uses much less helium and nitrogen gases necessary for maintaining the cold temperature.

With the two vertical walls 22, 23 between the horizontal oppositely disposed sections 12 and 13, a complete low reluctance return path for the flux going through the air gap is available. In this manner, the five gauss stray field is completely contained within the unique magnet.

Figure 2:
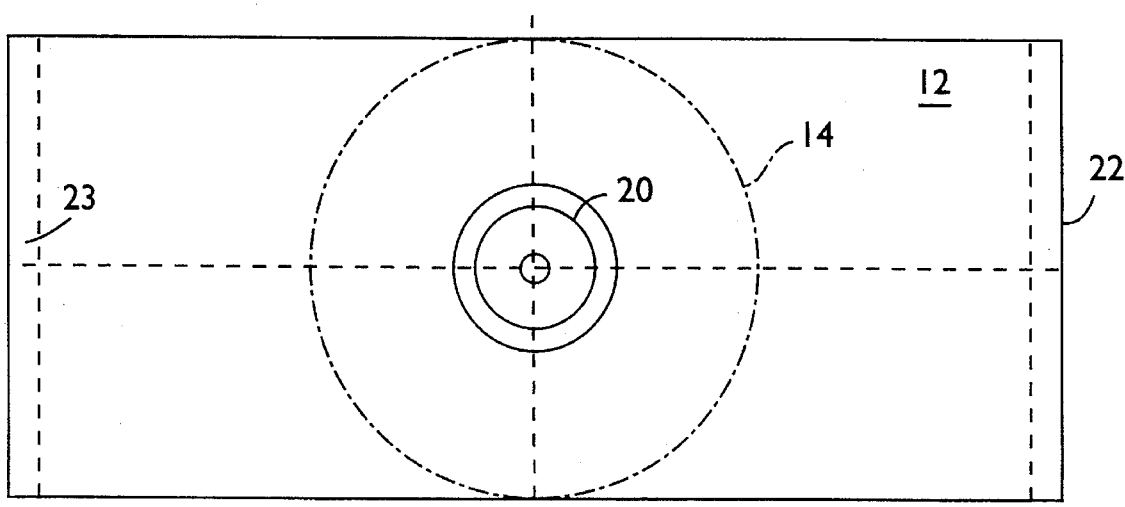
FIG. 2 is a plan view of the magnet of FIG. 1.
Figure 3:
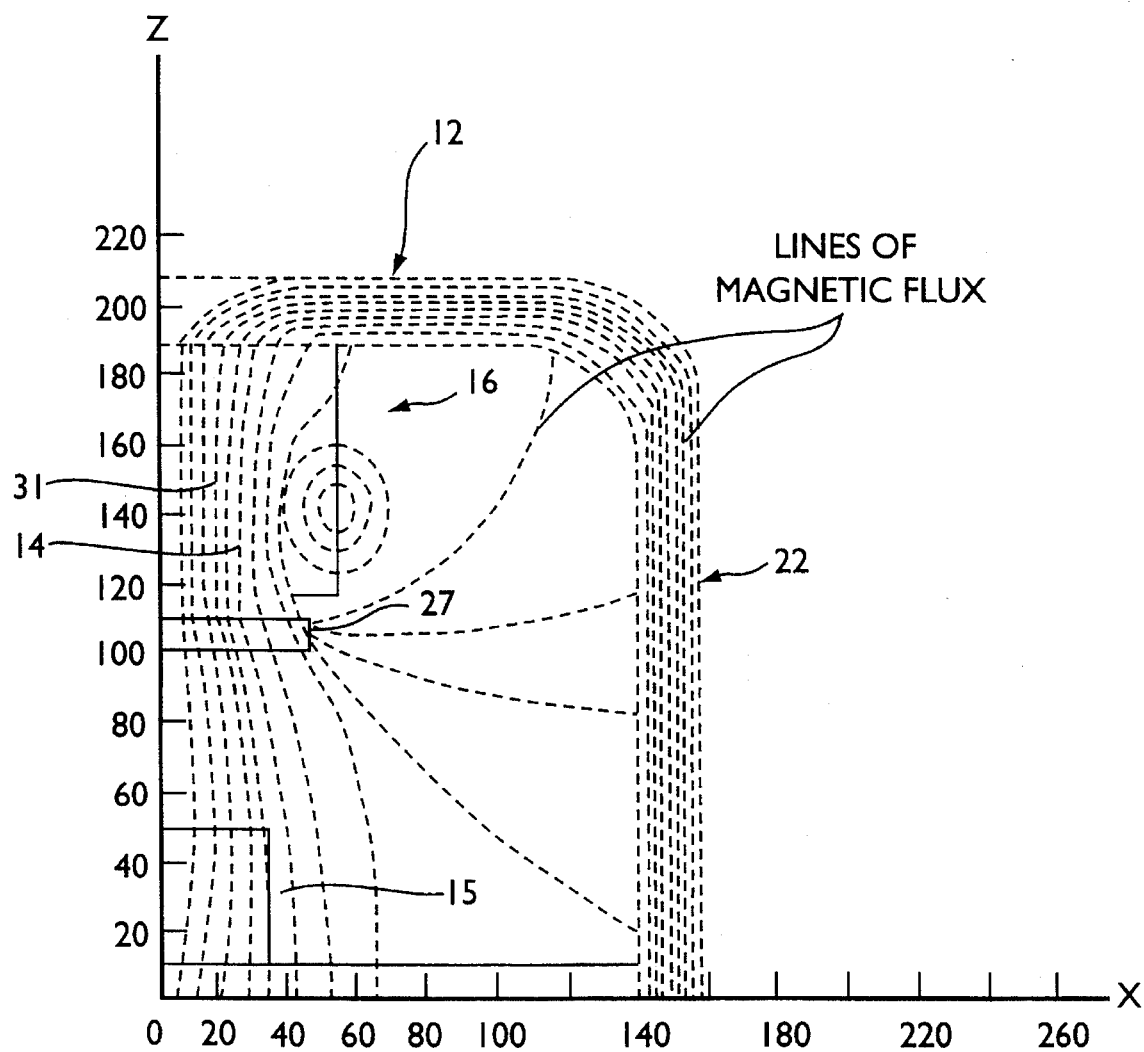
FIG. 3 is a showing of the flow of the lines of magnetic flux of the magnet of FIGS. 1 and 2.

FIG. 3 is a showing of the lines magnetic flux in an operating magnet such as shown in FIGS. 1 and 2. Therein the lines of magnetic flux generated by the superconducting coil 16 is shown at 31. It should be noted that the magnet shown in FIG. 3 is symmetrical about the axis OZ of FIG. 3 so just one quarter of the magnetic flux path is being shown. The flux is generated by the superconducting coil 16 positioned around the pole piece 14. This flux traverses the air gap between the active or wound pole piece 14 to the lower inactive pole piece 15. It also strays either towards the side walls, the floor or the ceiling of the magnet. The flux goes through the air gap and into pole piece 15 and from there it moves along through the floor 13, not shown in FIG. 3 and through the veritcal side wall 22 where it flows to top side 12 and from there back to the pole piece 14.

Note that in the view of FIG. 3 of the path taken by the magnetic flux, the shaping by the collimator plate 27 is illustrated. The collimator plate 27 is shaped so as to cause the lines of flux between the collimator plate and the pole piece 15 to be practically perfectly parallel and homogeneous. Thus, the area in which the patient is placed, i.e., the ellipsoid 26 (FIG. 1) defines a field that is homogeneous and ideal for use in magnetic resonance imaging. The homogenity may be further improved by passive shim 30 (FIG. 1).

Figure 4:
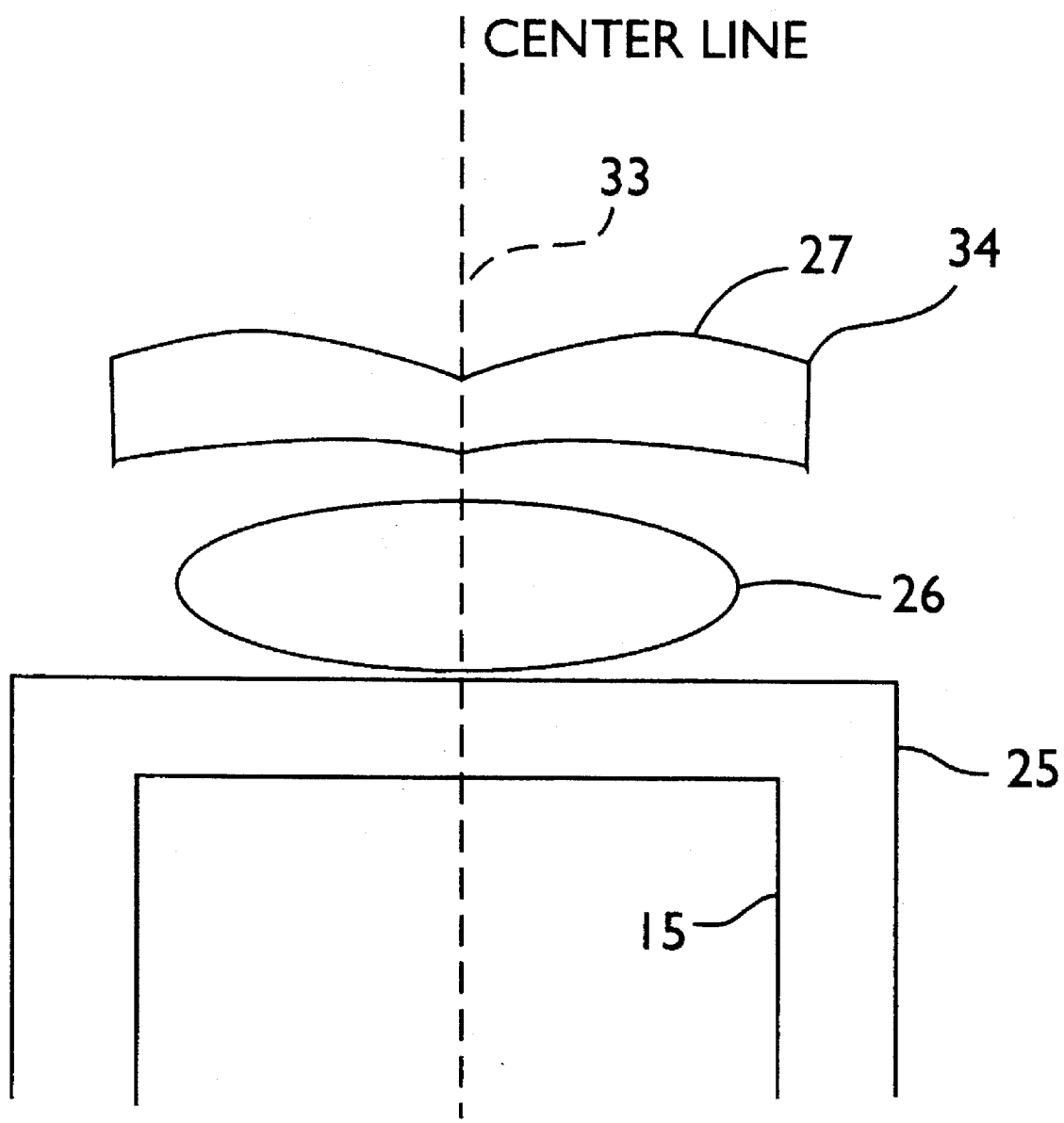
FIG. 4 is the front view showing of the optimized shape of the collimator shown in FIG. 1.

The collimator plate 27 is shown in more detail in FIG. 4. Therein, the collimator plate is shown located above the pole piece 15. A key feature of the plate 27 is the plate in cross sectional view is thicker at the side edges than at the center thereof. The center 33 of the plate 27 is noticeably less thick than is the side 34 of the plate.

Figure 5:
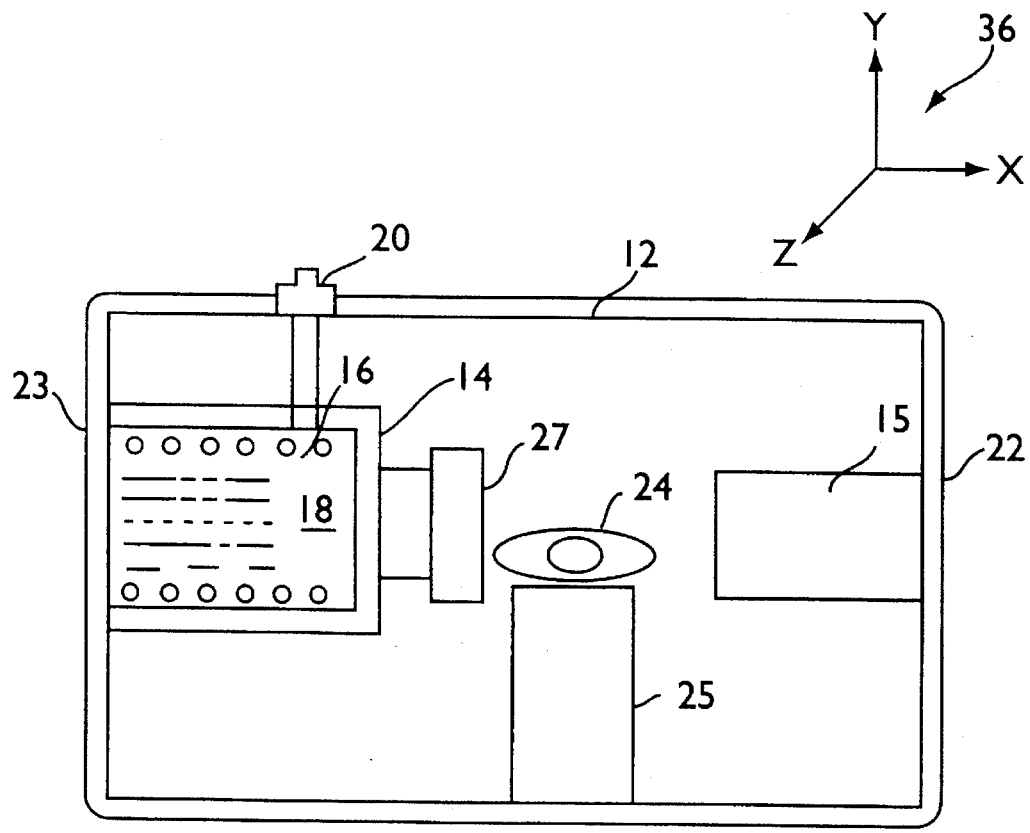
FIGS. 5, 6 and 7 are other versions of the magnet of FIG. 1.

The arrangement of FIG. 1 is only one embodiment, other embodiments are within the scope of the invention. For example, FIG. 5 shows an embodiment that is also a front view showing of the inventive MRI magnet. Therein, the pole pieces extend from the vertical walls such that the pole piece 14 is shown extending from wall 23 and the pole piece 15 is shown extending from wall 22. The patient is placed in the air gap between pole pieces 14 and 15. Here again, a collimator plate 27 is located closer to the active pole piece 14, with the patient between the collimator plate 27 and the inactive pole piece 15. The patient 24 is shown resting on a patient bed 25. In the arrangement of FIG. 5, the longitudinal axis of the patient is considered coaxial with the Z axis of the XYZ coordinate system shown in FIG. 5. The longitudinal axis of the patient in this description is considered coaxial with the Z axis. Thus, in FIG. 5, the X axis is coaxial with the static magnetic field. The Y axis is herein considered the vertical axis. In contrast, in FIG. 1, the longitudinal axis of the patient is along the Z axis, but the static magentic field is coaxial with the Y axis.

The turret 20 is shown again as being connected through the roof 12 to the cryo 18. The cryo maintains the coils 16 at superconducting temperatures.

Figure 6:
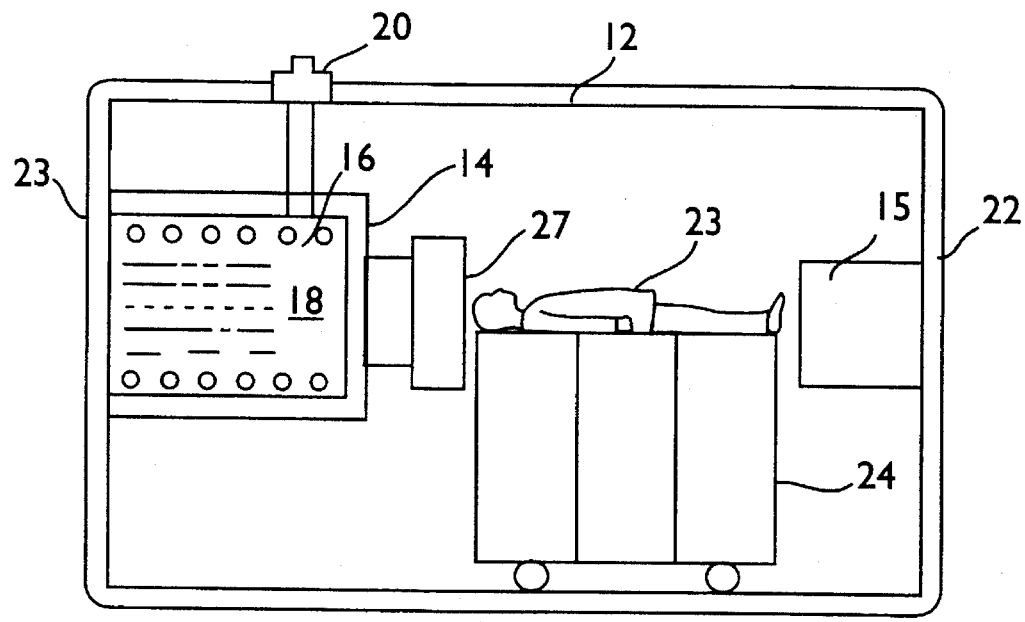

FIG. 6 is yet another embodiment of the inventive magnet system shown schematically. Here, the pole pieces again extend from the vertical walls 21 and 22 just as in FIG. 5. However, in this case, the patient is shown as having his longitudinal axis coaxial with the X axis just as the static magnetic field is also coaxial with the X axis. In this regard, the static magnetic field along the longitudinal axis of the patient is more in accordance with magnetic arrangement of the cylindrical magnets. The patient 24 is again shown between the inactive pole piece 15 and the collimator plate 27. The collimator plate is between the patient 24 resting on the bed 25 and the active pole piece 14. The active pole piece is shown as containing the cryostat 18 and the superconducting coil 16. Access to the cryostat is maintained through turret 20 just as in FIG. 6.

Figure 7:
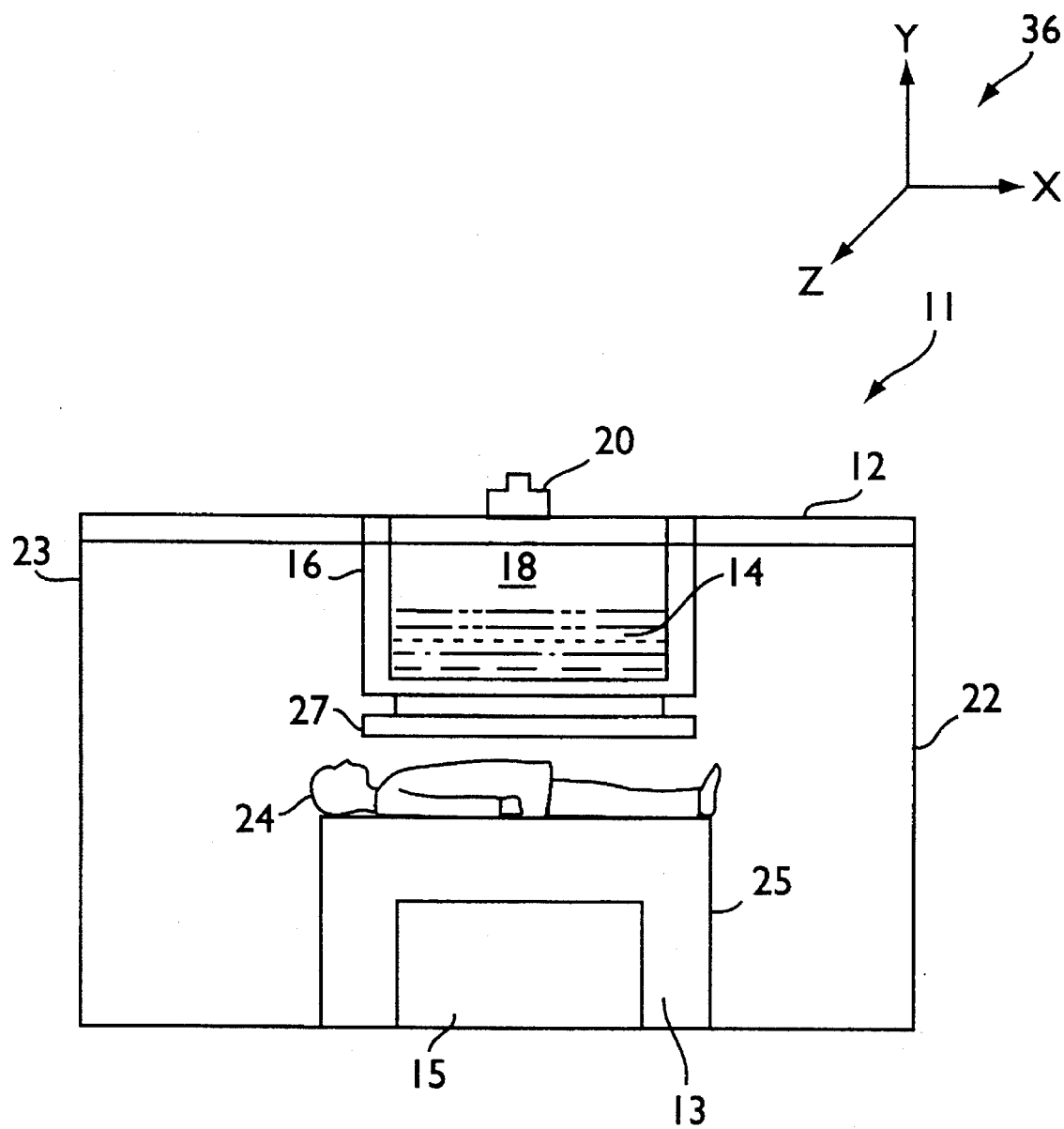

In FIG. 7, the pole pieces are shown as extending from the roof 12 and the floor 13 of the magnet. Thus, the roof of the magnet; i.e., magnetized metallic section 12 has active pole piece 14 extending therefrom. Similarly, the floor of the magnet 13 has the inactive pole piece 15 extending therefrom. The patient 23 is shown in the air gap between the pole pieces. The patient 23 is shown in the air gap between the pole pieces. The collimator plate 27 is between the patient 24 and the active pole piece 14 for shaping the magnetic lines of flux to improve the homogeneity of the magnetism around the patient. Vertically extending and oppositely disposed walls 22 and 23 close the path for the lines of magnetic flux generated by the coil 16 within the cryostat 18 of the magnetic arrangement 11 shown in FIG. 7. In FIG. 7 the static magnetic field is coaxial with the Y axis.

Inventive features of the invention include:
1) the arrangement which enables ready access to the patient;
2) a smaller cryostat than that used for cylindrical units;
3) the 5 gauss stray field is completely within the walled magnet unit; and
4) the smaller cryo assures greatly reduced costs of maintaining the superconductor and of the cryostat compared with the cost of maintaining the cryostats in the cylindrical magnets.

While the invention has been described with reference to a preferred embodiment, it should be understood that this embodiment is exemplary only, it is not meant to act as a limitation on the scope of the invention.

What is claimed is:

1. A magnet for MRI systems, said magnet comprising:

a first pair of spaced apart oppositely disposed walls, a first pole piece extending from one of said walls of said first pair of walls toward a second pole piece extending from the other wall of said first pair of walls, an air gap between said first and second pole pieces, a superconducting coil on at least one of said first and said second pole pieces for generating a magnetic field between said pole pieces, said air gap being sufficiently large for receiving a patient therein for being imaged using magnetic resonance, and a second pair of spaced apart oppositely disposed walls connecting said first pair of oppositely disposed walls at opposite ends thereof to form an open cubicle, said first and second pairs of oppositely disposed walls completing a magnetic circuit extending through said pole pieces and said air gap, said pairs of walls being spaced apart a distance sufficient to enable medical personnel to walk within the cubicle providing ready and complete access to said patient within said airgap between said pole pieces.

2. The magnet for MRI systems of claim 1 including:

gradient coils for causing three orthogonal gradients in said air gap, and

RF coil means for transmitting RF magnetic fields into said air gap and for receiving FID from the patient in the air gap.

3. The magnet for MRI systems of claim 1 wherein said first pair of oppositely disposed walls are horizontal and said second pair are vertical.

4. The magnet for MRI systems of claim 1 wherein said first pair of oppositely disposed walls are vertical and said second pair are horizontal.

5. The magnet for MRI systems of claim 4 including a patient bed for holding said patient coaxial with said magnetic field.

6. The magnet for MRI systems of claim 4 including a patient bed for holding said patient normal to said magnetic field.

7. The magnet for MRI systems of claim 1 wherein said first and second pairs of walls and said pole pieces provide a substantially complete path of magnetizable material except for the air gap.

8. The magnet for MRI systems of claim 1 including means for shaping the magnetic field in said air gap to increase the homogeneity of said field around the patient.

9. The magnet for MRI systems of claim 8 wherein said means for shaping the magnetic field comprises a shaped plate.

10. A magnet for MRI systems of claim 9 wherein said plate is shaped so that in cross section the center of the plate is the thinnest portion thereof.

11. The magnet for MRI systems of claim 10 wherein said shaped plate extends from a pole piece having the superconducting coil thereon towards said second pole piece.

12. The magnet of claim 1 wherein said superconducting coil uses low temperature superconducting wire.

* * * * *